(12) United States Patent
Liang et al.

(10) Patent No.: US 7,674,574 B2
(45) Date of Patent: Mar. 9, 2010

(54) METHOD OF ARRANGING MASK PATTERNS

(75) Inventors: Ya-Min Liang, Tai-Chung Hsien (TW); Chien-Kuo He, Taipei Hsien (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 684 days.

(21) Appl. No.: 11/164,663

(22) Filed: Dec. 1, 2005

(65) Prior Publication Data

US 2007/0128524 A1   Jun. 7, 2007

(51) Int. Cl.
*G03C 5/00* (2006.01)
(52) U.S. Cl. .................................. 430/394; 438/149
(58) Field of Classification Search ............... 430/5, 430/394, 22, 321, 322; 355/53; 349/38, 349/43, 122, 141, 187; 438/149, 151
See application file for complete search history.

(56) References Cited

U.S. PATENT DOCUMENTS 5,968,693 A * 10/1999 Adams ..................... 430/30
6,204,912 B1 * 3/2001 Tsuchiya et al. ............ 355/53
6,213,607 B1 4/2001 Watanabe et al.
2005/0128407 A1 * 6/2005 Lee et al. .................. 349/141
2006/0088790 A1 * 4/2006 Moon et al. ................ 430/319

FOREIGN PATENT DOCUMENTS

| JP | P2003-57661 A | 2/2003 |
| JP | P2003-115498 A | 4/2003 |
| JP | P2004-163922 A | 6/2004 |

* cited by examiner

*Primary Examiner*—Mark F Huff
*Assistant Examiner*—Stewart A Fraser
(74) *Attorney, Agent, or Firm*—Winston Hsu

(57) ABSTRACT

A method of arranging mask patterns, which includes a first mask has a first mask pattern, a second mask has a second mask pattern. The distance between the first mask boundary and the first mask pattern boundary is different form the distance between the second mask boundary and the second mask pattern boundary.

21 Claims, 6 Drawing Sheets

METHOD OF ARRANGING MASK PATTERNS

BACKGROUND OF THE INVENTION

1. Field of the Invention

The present invention relates to a method of arranging mask patterns, more particularly, to a method of arranging several mask patterns have different corresponding positions with lenses to lessen the lens mura of the panel.

2. Description of the Prior Art

In an exposure process, a light source of a scan exposure apparatus produces exposure light, like i-line, KrF, ArF, etc. The light passes through a mask and a projection lens to project on a photoresist of a semiconductor wafer or a glass substrate. The circuit pattern on the mask is transferred to the planned section of the substrate (called "a scan") to be a hard mask of the etching or the ion implanting. Then, the plate stage or the mask stage of the scan exposure apparatus moves toward the next position and repeats the same exposure, and the pattern of the mask is transferred to the photo-resist of the whole substrate step by step.

Recently, the size of LCD and PDP monitors have become bigger and bigger, and the size of the mask have become bigger, too. Therefore, the lenses of the recent exposure apparatus are combined by a plurality of lenses. The pattern of the mask is transferred to the glass substrate in the ratio of 1:1. However, every lens has a slight difference, lenses have overlapping sections, or the projection lenses have a precision bias after a long period of use.

Please refer to FIG. 1. FIG. 1 is schematic diagram of a corresponding position of a mask pattern and a lens of an exposure apparatus according to the prior art. The five masks in FIG. 1 are the exposure masks in the general TFT LCD manufacture process. The five masks are individually the gate electrode (GE) mask I, the semiconductor (SE) mask II, the source/drain (SD) mask III, the contact hole(CH) mask IV, and the pixel electrode (PE) mask V. Each of them has a corresponding mask pattern 102, 104, 106, 108, and 110 on the center of the masks I, II, III, IV, and V. All of the five masks I, II, III, IV, V have the width of L, and the mask patterns 102, 104, 106, 108, 110 have the width of I respectively.

Please note that, lenses of the exposure apparatus usually have n lenses, and the lens and the adjacent lens intercross and have a lens overlapping section. Hence, FIG. 1 illustrates the masks I, II, III, IV and V in the exposure apparatus, the corresponding position of each lens overlapping section 112, 114, 116, 118 and 120, the mask patterns 102, 104, 106, 108 and 110, and the masks I, II, III, IV and V. The distances of the mask patterns 102, 104, 106, 108 and 110 with the lens overlapping sections 112, 114, 116, 118 and 120 are z. The distance of the boundary of the masks I, II, III, IV and V with the boundary of the mask patterns 102, 104, 106, 108 and 110 are A for clear illustration in the prior art. But, the distance of the boundary of the mask and the boundary of the mask pattern isn't a fixed width in real manufacture.

Please refer to FIG. 2. FIG. 2 is a schematic diagram of photoresist patterns after exposure of the mask patterns of FIG. 1. FIG. 2 continues the condition of FIG. 1. Photoresist layers I', II', III', IV', and V' are the schematic diagrams of the masks I, II, III, IV and V exposure on the glass panel. That means following the process of the scanning exposure apparatus, one section of the glass panel will be exposed by the masks I, II, III, IV and V in sequence. Therefore, in FIG. 2, the photoresist layers I', II', III', IV', V' and the photoresist patterns 202, 204, 206, 208, 210 individually show the diagrams of the masks I, II, III, IV, V and the mask patterns 102, 104, 106, 108, 110 exposed on the glass panel.

As an example of the ratio 1:1, after completing many PEPs (photo-etching-processes), the width of the photoresist layers I', II', III', IV', V' are L, and the width of the photoresist patterns 202, 204, 206, 208, 210 are I. The distances of the boundaries of photoresist layer I', II', III', IV', V' and the boundaries of photoresist patterns 202, 204, 206, 208, 210 are A as the distance of the boundaries of the masks I, II, III, IV, V and the boundaries of the boundaries of the mask patterns 102, 104, 106, 108, 110. The distances of the photoresist patterns 202, 204, 206, 208, 210 with the lens sections 212, 214, 216, 218, 220 are z as the distance of the mask patterns 102, 104, 106, 108, 110 with the lens overlapping sections 112, 114, 116, 118, 120. Finally, every lens section 212, 214, 216, 218, 220 is in the same position of the photoresist layer I', II', III', IV', V'.

Please refer to FIG. 3. FIG. 3 is schematic diagram of transfer patterns of FIG. 2 after exposure. As FIG. 3 shows, glass panel 302 has a plurality of transfer patterns 304. Each transfer pattern 304 is exposed by the above-mentioned five masks in the same section of the glass panel 302. That is why every lens overlapping section 212, 214, 216, 218, 220 in FIG. 2 is in the same position of the photoresist layers I', II', III', IV', V' and the photoresist patterns 202, 204, 206, 208, 210. And, each transfer pattern 304 on the glass panel 302 has an obvious lens mura 306.

As mentioned above, because of the precision bias after a long period of use, the lenses overlapping sections of the prior art exposure apparatus become the uniformity of the exposure light from each lens. So, in the prior art, after many mask exposures, the many PEP is complete, and the monitor has various critical dimensions (CD) and overlays in a few sections of the panel. The monitor has lens mura. The quality of the product drops, and the yield of manufacture decreases. Therefore, to solve the lens mura problem is an important issue.

SUMMARY OF THE INVENTION

The present invention relates to a method of arranging mask patterns, more particularly, to a method of arranging several mask patterns have different corresponding positions with lenses to lessen the lens mura of the panel, to solve the above-mentioned problem.

The embodiment of the present invention relates to a method of arranging the mask pattern. The method comprising providing a first mask having a first mask pattern and a second mask having a second mask pattern, the distance between the first mask pattern and the first mask being different from the distance between the second mask pattern and the second mask.

The other embodiment of the present invention relates to a method of mending a lens mura, the being applied in an exposure apparatus has a plurality of lenses, the method at least comprising providing a first mask pattern and a second mask pattern, and positioning the lenses to have different corresponding positions with the first mask pattern and the second mask pattern during an exposure process.

In the present invention, five mask patterns of the five masks have different distances with the lenses of the exposure apparatus in the TFT LCE exposure processes, so the distance of the photoresist patterns and the lenses are different, which amends the lens mura of the glass panel to solve the prior art problem.

These and other objectives of the present invention will no doubt become obvious to those of ordinary skill in the art after

DETAILED DESCRIPTION

Figure 1:
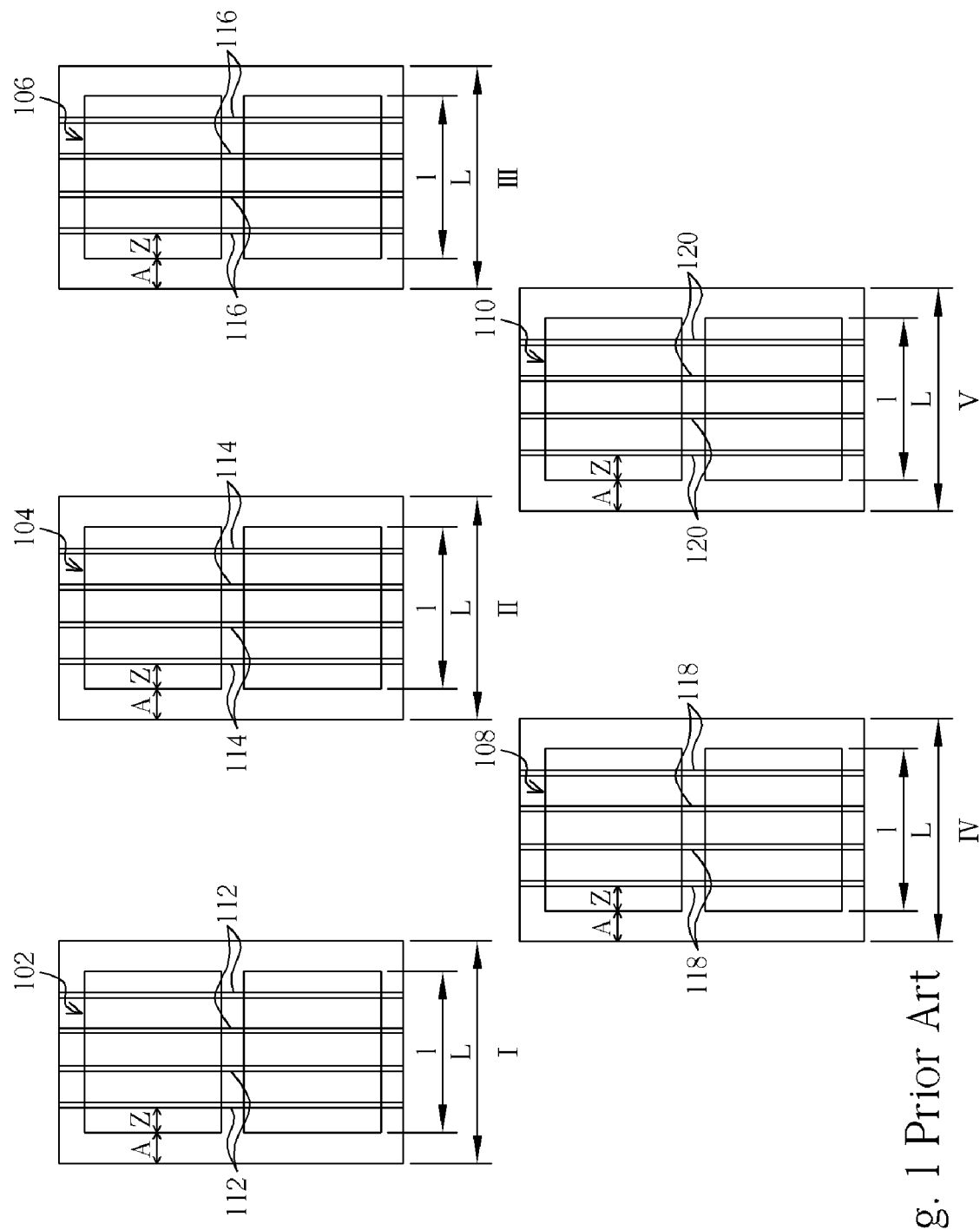
FIG. 1 is schematic diagram of a corresponding position of a mask pattern and a lens of an exposure apparatus according to the prior art.
Figure 2:
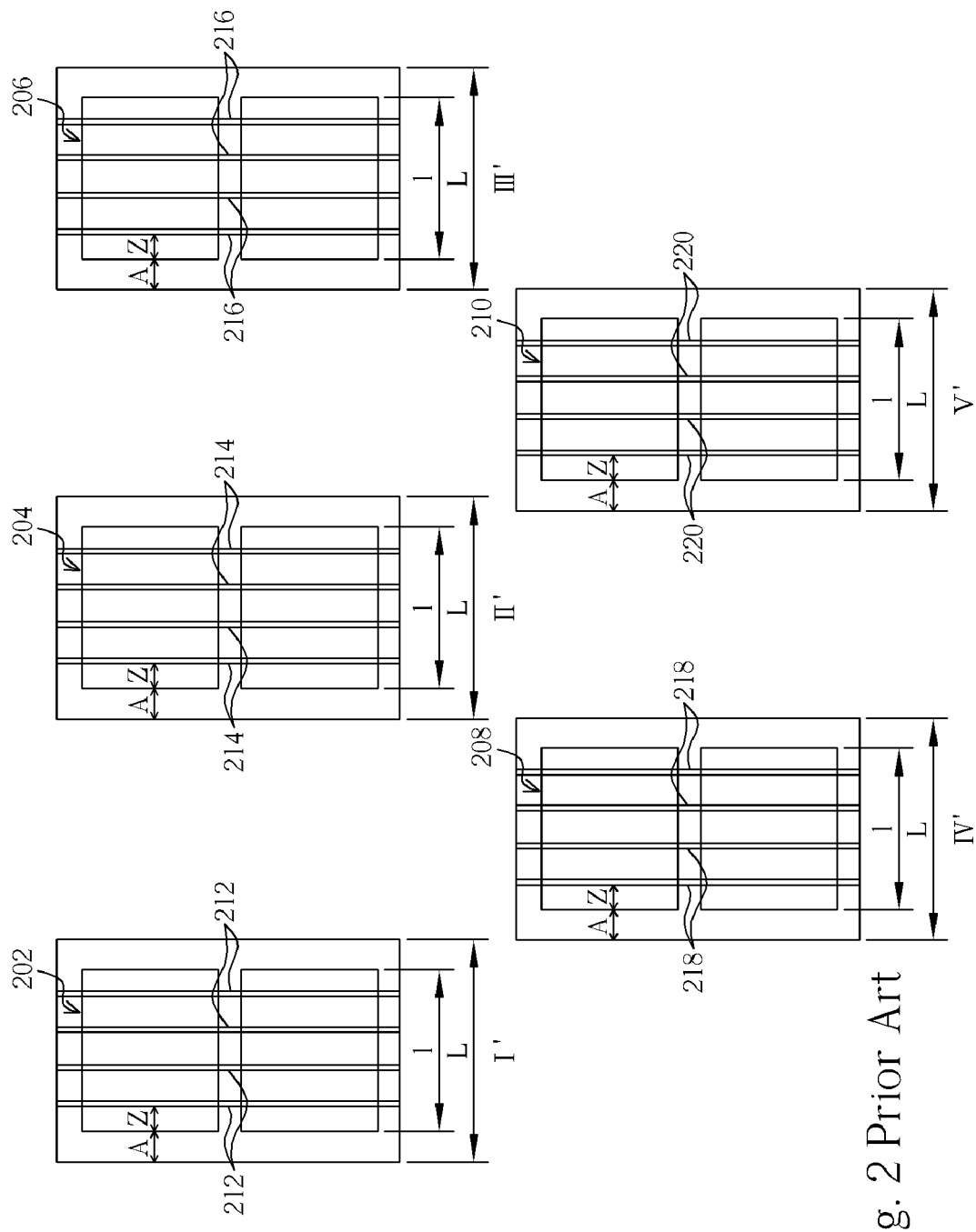
FIG. 2 is a schematic diagram of photoresist patterns after exposure of the mask patterns of FIG. 1.
Figure 3:
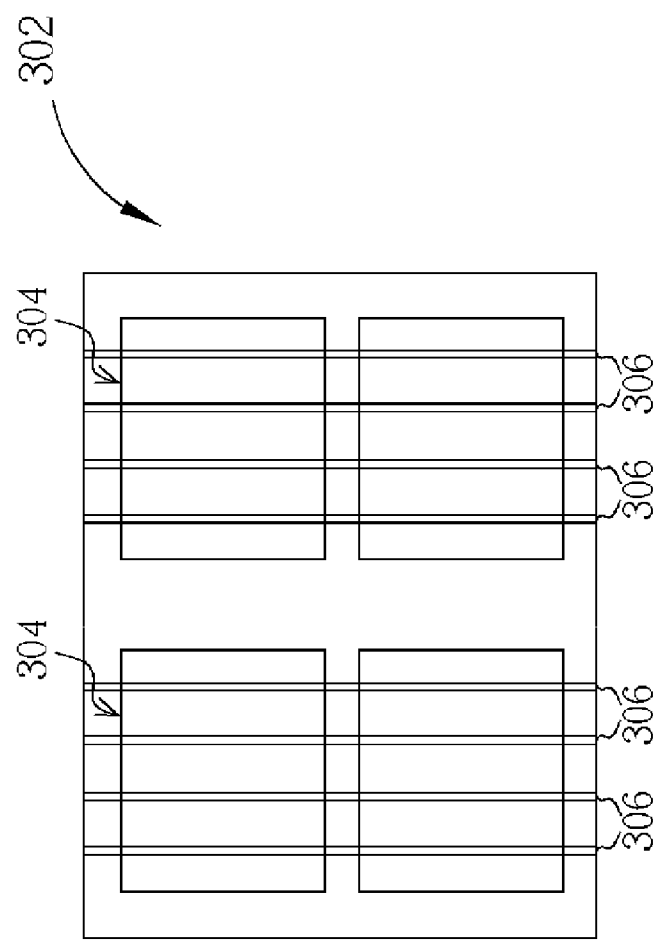
FIG. 3 is schematic diagram of transfer patterns of FIG. 2 after exposure.
Figure 4:
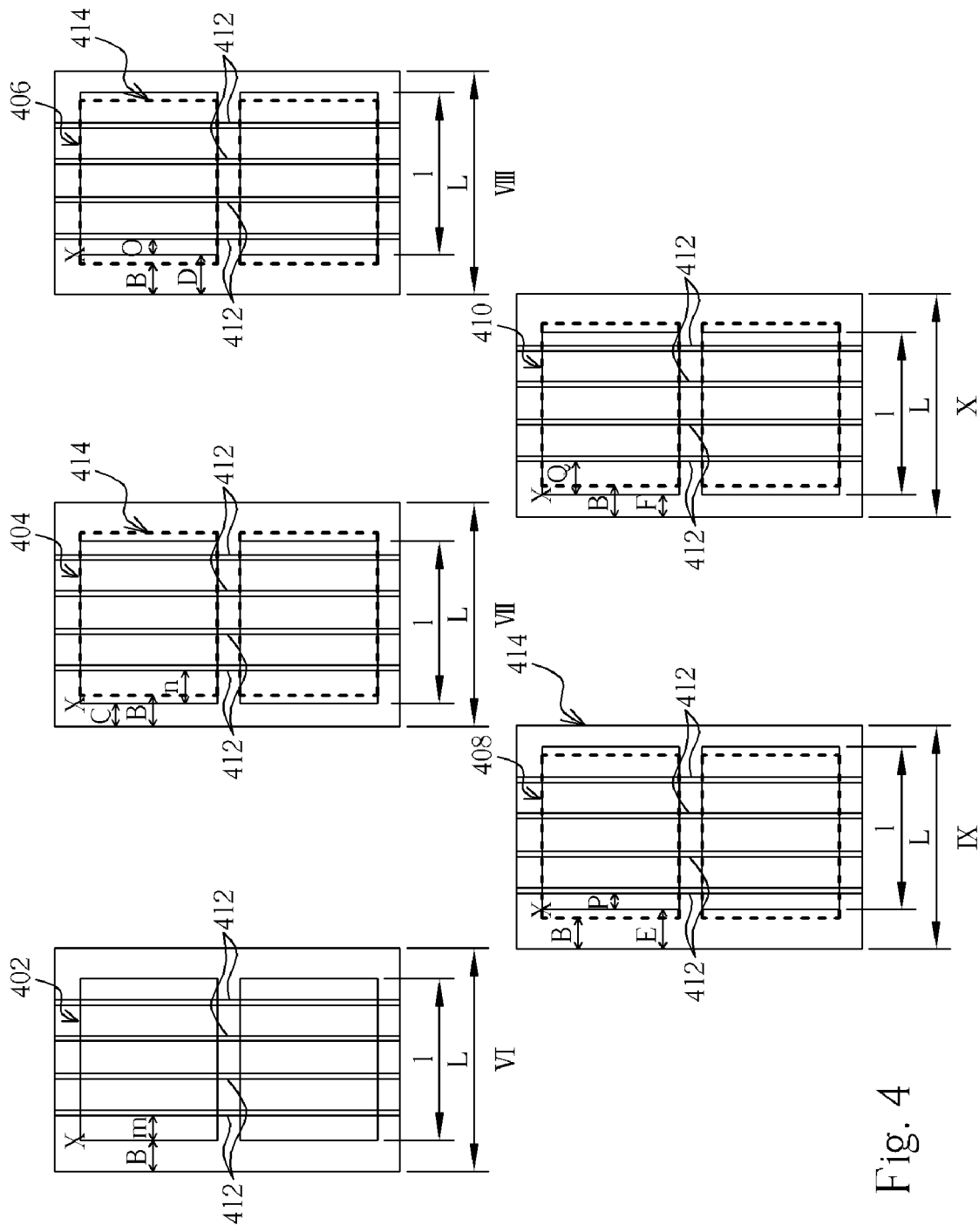
FIG. 4 is schematic diagram of the corresponding position of the mask pattern and the lenses of the exposure apparatus according to the present invention.

Please refer to FIG. 4. FIG. 4 is schematic diagram of the corresponding position of the mask pattern and the lenses of the exposure apparatus according to the present invention. For convenience, the preferred embodiment of the present invention uses five masks for five different PEP processes to illustrate the method of arranging the mask patterns for TFT LCD exposure process. These five masks have the same size, they individually are a gate electrode (GE) mask VI, a semiconductor (SE) mask VII, a source/drain (SD) mask VIII, a contact hole(CH) mask IX, a pixel electrode (PE) mask X. The sequence of these five masks is masks VI, VII, VIII, IX, X in TFT LCD manufacture. The scan exposure apparatus is able to transfer a predetermined pattern into the glass panel (not shown) and produce the corresponding photoresist pattern (not shown).

As FIG. 4 shows, the width of the masks VI, VII, VIII, IX, X is L, the width of the mask patterns is I. Otherwise, FIG. 4 illustrates the corresponding position of the lens overlapping section 412 with the mask pattern 402 and mask VI, when the mask VI processes exposure in an exposure apparatus. In the same way, this embodiment is illustrated by many lenses and the lens and the adjacent lens overlap each other. Therefore, each mask VI, VII, VIII, IX and X in FIG. 4 has many lens overlapping sections 412.

In the embodiment of the present invention, the distance between the boundary of the mask VI and the boundary of the mask pattern 402 is B (the reference boundary is left line). The parallel distance between the boundary of the mask pattern 402 and the lens overlapping section 412 is m. The parallel distance between the boundary of the mask VII and the boundary of the mask pattern 404 is C (the reference boundary is left line). C is less or greater than B. The parallel distance between the boundary of the mask pattern 404 and the boundary of the lens overlapping section 412 is n, n being greater or less than m. In the same way, the mask patterns 406, 408, 410 on the masks VIII, IX, X have parallel distances D, E, F individually. And, the parallel distances between the mask patterns 406, 408, 410 and the lens overlapping sections 412 are o, p, q. Otherwise, for convenience, as FIG. 4 shows, a dotted line contrast mask pattern 414 is drawn on each of masks VII, VIII, IX, X. It presents a reference mask pattern having a B parallel distance with the boundary of the mask (the same with the distance relation between the mask VI and the mask pattern 402). The contrast mask pattern 414 of the embodiment clearly shows the mask patterns 402, 406, 408, 410 position movement.

Please note that each lens in the recent exposure apparatus has the same size. The distance and the position of each lens are fixed values. So, when the same size masks are put on the exposure apparatus, each mask has a fixed position with the lenses. But, in the present invention, each mask pattern has different distance with each mask, which causes each mask to have a different distance with the lenses in the exposure apparatus. Especially, each mask pattern has a different distance with the lens overlapping section.

Figure 5:
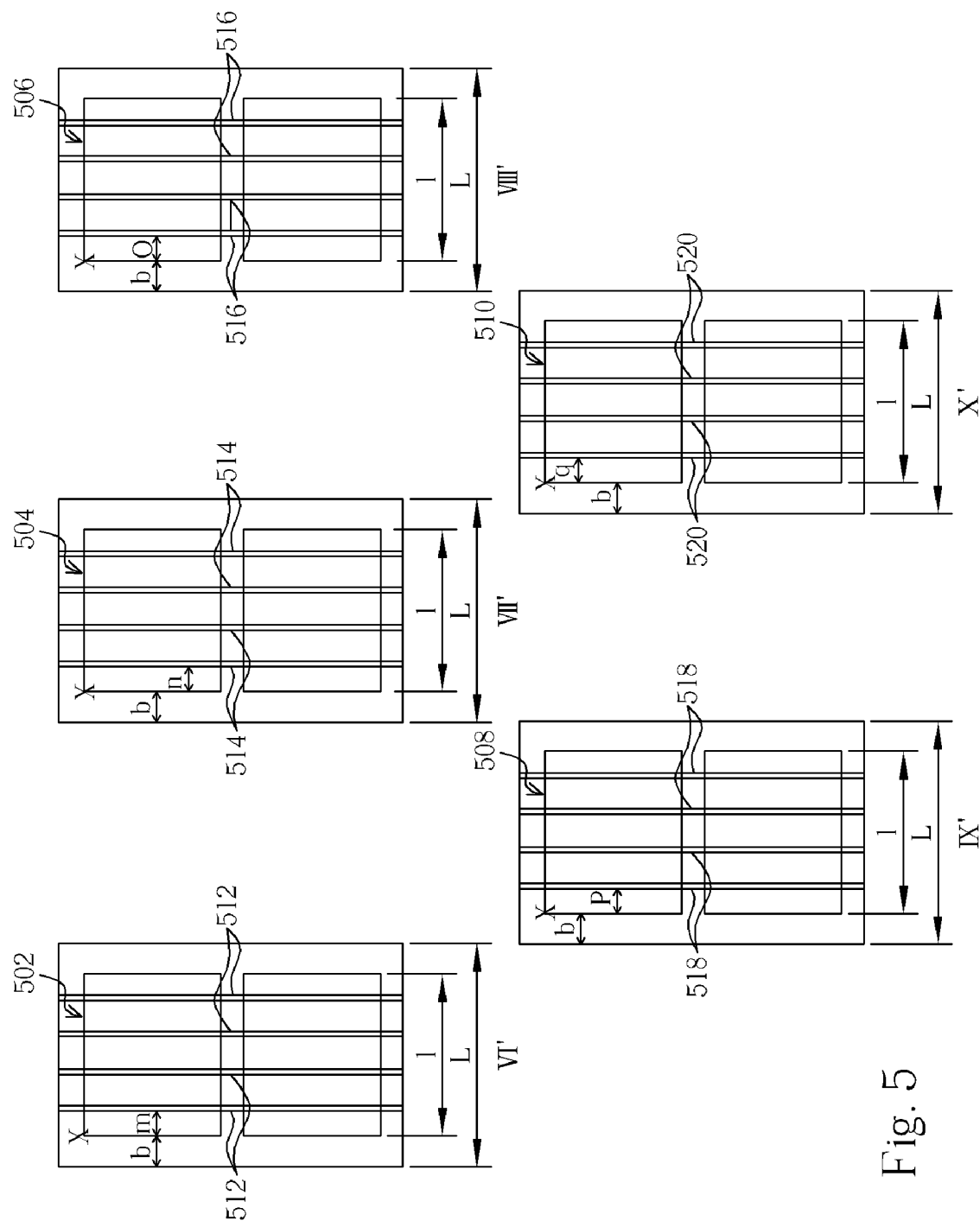
FIG. 5 is a diagram of the photoresist pattern after the mask pattern of FIG. 4 exposure process.

Please refer to FIG. 5. FIG. 5 is a diagram of the photoresist pattern after the mask pattern of FIG. 4 exposure process. FIG. 5 continues the conditions of FIG. 4. The mask VI, VII, VIII, IX, X expose and transfer to the glass panel on the photoresist layers VI', VII', VIII', IX', X' in FIG. 5. That means one position of the glass panel will be exposed by every PEP and the mask VI, VII, VIII, IX, X sequencing. As FIG. 5 shows, photoresist layers VI', VII', VIII', IX', X' are presented individually and the mask patterns 402, 404, 406, 408, 410 on the mask VI, VII, VIII, IX, X expose singly on the glass panel. This situation does not reflect the real situation, in which the next exposure will cover the last photoresist pattern.

Please refer to FIG. 5, the parallel distance between the mask pattern 502 and the lens overlapping section 512 is m. And the parallel distance between the mask pattern 504, 506, 508, 510 and the lens overlapping section 514, 516, 518, 520 individually are n, o, p, q. That is caused by the parallel distance between the mask pattern 402, 404, 406, 408, 410 and the lens overlapping section 412 are m, n, o, p, q in FIG. 4. Therefore, the final mask pattern has no lens mura after five exposure. Because the parallel distance between every mask pattern and the lens overlapping section is different, each lens mura is formed in different position of the photoresist layer and the lens mura is blurred. LCD of the present invention has no lens mura.

Figure 6:
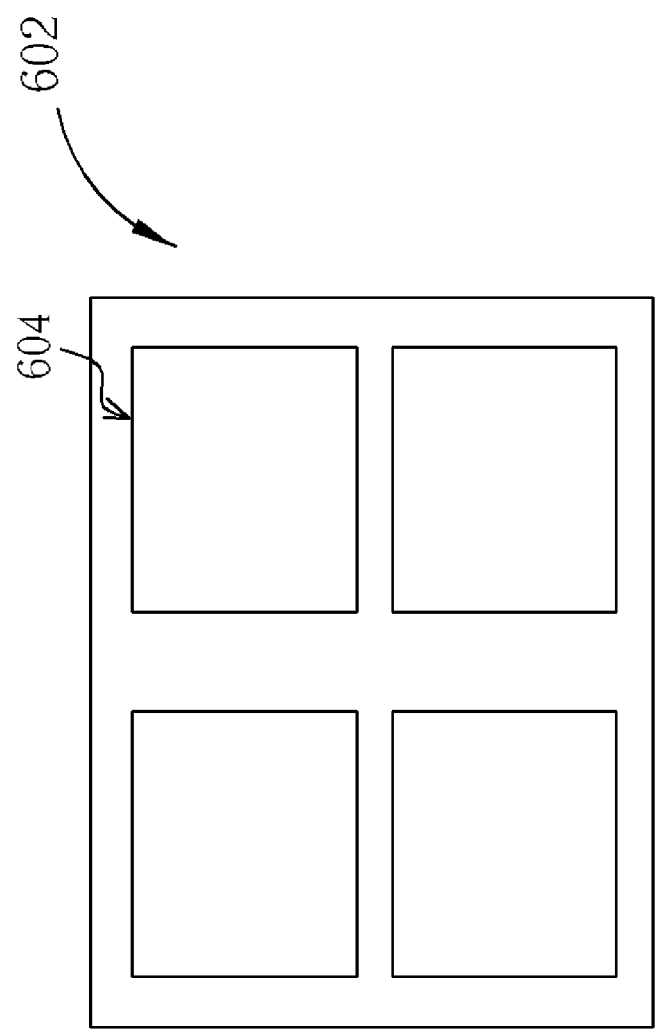
FIG. 6 is a schematic diagram of a transfer pattern after the mask patterns of FIG. 5 exposed.

Please refer to FIG. 6. FIG. 6 is a schematic diagram of a transfer pattern after the mask patterns of FIG. 5 exposed. As FIG. 6 shows, the glass panel 602 has a plurality of transfer pattern 604. Each of transfer patterns 604 in the same section of the glass panel 302 is made by the above-mentioned five masks exposure. Therefore, each lens overlapping section 512, 514, 516, 518, 520 fall on the different position of the photoresist layers VI', VII', VIII', IX', X and the photoresist patterns 502, 504, 506, 508, 510. Finally, the transfer pattern 604 on the glass panel 602 will not have lens mura.

Please note that, the present invention can choose to change the corresponding position of the mask pattern 406 and the mask VIII in FIG. 4mask. The key process of the exposure process of TFT LCD manufacture is the mask VIII for the source/drain process in FIG. 4. Every TFT channel length is a fixed value that can maintain stable and uniform TFT electrical performance. So, in the present invention, the distances between the mask pattern 402, 404, 408,410 of the mask VI, VII, IX,X and the lens overlapping section 412 can be the same. But the mask VIII must be different. And, forming a gate is an important process in the TFT manufacture, so the distances of the mask patterns 402, 406, the lens overlapping section 412, and the mask VI, VIII are different. And the others can be the same.

Comparing to the prior art, because these five mask patterns of the five masks have different distances with the lenses of the exposure apparatus in the present invention, the distance of the photoresist patterns and the lenses are different, that amends the varied critical dimension (CD) and varied overlay of the fixed position (corresponds the lens overlapping section) on the glass panel, and blurs the lens mura. The present invention improves the problem of the prior art, in which the lens overlapping sections fall in the same position of the glass panel, and the lens mura is produced, the yield decreases, and the products quality decreases.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of arranging mask patterns, the method providing a first mask with a first mask pattern which is independent and complete thereon for forming a first element and a second mask with a second mask pattern which is independent and complete thereon for forming a second element and the first element and the second element are formed in different PEP processes, the first and second masks being applied with an exposure process the horizontal distance between the first mask pattern and the first mask being different from the horizontal distance between the second mask pattern and the second mask wherein the first mask pattern is a gate electrode (GE) mask pattern, the second mask pattern is a source/drain (SD) mask pattern, and the exposure process further comprises a third mask pattern, a fourth mask pattern and fifth mask pattern.

2. The method of claim 1, wherein the exposure process is with a TFT LCD exposure process.

3. The method of claim 2, wherein the exposure process is used by an exposure apparatus having a plurality of lenses.

4. The method of claim 3, wherein the exposure apparatus comprises a scan exposure.

5. The method of claim 2, wherein the third mask pattern is a semiconductor (SE) mask pattern, the fourth mask pattern is a contact hole (CH) mask pattern, and the fifth mask pattern is a pixel electrode (PE) mask pattern.

6. The method of claim 5, wherein the sequence of the mask pattern in the exposure process is the first mask pattern, the third mask pattern, the second mask pattern, the fourth mask pattern, and the fifth mask pattern.

7. The method of claim 2, wherein the third mask pattern, the fourth mask pattern and the fifth mask pattern are individually formed on the third mask, the fourth mask and the fifth mask.

8. The method of claim 7, wherein the corresponding position of one of the third, fourth, fifth mask patterns with the third, fourth, fifth masks is selected to be different from the corresponding positions of the first and second mask patterns and the first and second masks.

9. The method of claim 7, wherein the corresponding positions of two of the third, fourth, fifth mask patterns with the third, fourth, fifth masks are selected to be different with the corresponding positions of the first and second mask patterns and the first and second masks.

10. The method of claim 7, wherein the corresponding positions of the first mask pattern, the second mask pattern, the third, the fourth, the fifth mask patterns with the first, second, third, fourth, fifth masks are different from each other.

11. The method of claim 2 is able to mend a lens mura of the exposure process of the TFT LCD.

12. A method of mending a lens mura, the method being applied in an exposure apparatus having a plurality of lenses, the method at least comprising:

providing a first mask pattern which is independent and complete for forming a first element and a second mask pattern which is independent and complete for forming a second element and the first element and the second element are formed in different PEP processes; wherein the first mask pattern is a gate electrode (GE) mask pattern, the second mask pattern is a source/drain (SD) mask pattern and positioning the lenses to have different corresponding positions with the first mask pattern and the second mask pattern during an exposure process wherein the exposure process further comprises a third mask pattern, a fourth mask pattern and fifth mask pattern.

13. The method of claim 12, wherein the exposure apparatus is a scan exposure apparatus and the exposure process comprises a TFT LCD exposure process.

14. The method of claim 13, wherein the third mask pattern is a SE mask pattern, the fourth mask pattern is a CH mask pattern, and the fifth mask pattern is a PE mask pattern.

15. The method of claim 14, wherein the sequence of the mask pattern in the exposure process is the first mask pattern, the third mask pattern, the second mask pattern, the fourth mask pattern, and the fifth mask pattern.

16. The method of claim 13, wherein the corresponding position of one of the third, fourth, fifth mask patterns with the lenses are selected to be different from the corresponding positions of the first and second mask patterns and the lenses.

17. The method of claim 13, wherein the corresponding positions of two of the third, fourth, fifth mask patterns with the lenses are selected to be different from the corresponding positions of the first and second mask patterns and the lenses.

18. The method of claim 13, wherein the corresponding positions of the first mask pattern, the second mask pattern, the third, the fourth, the fifth mask patterns with the lenses are different from each other.

19. The method of claim 13, wherein the first mask pattern, the second mask pattern, the third mask pattern, the fourth mask pattern and the fifth mask pattern are individually formed on the first mask, the second mask, the third mask, the fourth mask and the fifth mask.

20. The method of claim 19, wherein the method of making the lenses has different corresponding position with the first mask pattern and the second mask pattern is the corresponding position of the first mask pattern in the first mask is different from the corresponding position of the second mask pattern in the second mask.

21. The method of claim 19, wherein the method of separating each mask pattern from the lenses is done by means of each mask pattern being correspondingly positioned in the different position of each mask.

* * * * *